United States Patent [19]

Hile et al.

[11] Patent Number: 4,602,503

[45] Date of Patent: Jul. 29, 1986

[54] ENVIRONMENTAL CHAMBER

[75] Inventors: John R. Hile, Black Mountain; W. Ross Hile, Ridgecrest, both of N.C.

[73] Assignee: Parameter Generation & Control, Inc., Black Mountain, N.C.

[21] Appl. No.: 753,922

[22] Filed: Jul. 11, 1985

[51] Int. Cl.$^4$ .............................................. G01F 15/14
[52] U.S. Cl. ................................................ 73/432 SD
[58] Field of Search ........................ 73/117.1, 432 SD; 374/57

[56] References Cited

U.S. PATENT DOCUMENTS 2,439,806   4/1948   Heineman .................... 73/432 SD X

FOREIGN PATENT DOCUMENTS 571294   8/1945   United Kingdom ........... 73/432 SD

Primary Examiner—Jerry W. Myracle
Attorney, Agent, or Firm—Brady, O'Boyle & Gates

[57] ABSTRACT

An environmental chamber for testing objects, such as electronic components under climatic conditions, in the range of 80° C. to 150° C. and relative humidities in the range of 70% to 95%. The test chamber is pressurized and supplied with moisturized, heated air to obtain the desired climatic condition, the climatic condition being maintained by surrounding the test chamber with an insulated housing. A double door arrangement is provided to effect a pressure seal and for isolation of the test chamber from any appreciable heat loss.

6 Claims, 2 Drawing Figures

ENVIRONMENTAL CHAMBER

BACKGROUND OF THE INVENTION

Heretofore, the environmental testing of electronic components was routinely done at a temperature of 85° C. and 85% relative humidity, resulting in little or no data after many test hours lasting over a period as much as two to three months. In response to the needs of the electronic industry requiring an accelerated temperature/humidity testing in their quality control and research and development testing of integrated circuits, as well as other materials associated with the manufacture of these components, the environmental chamber of the present invention has been devised which is capable of maintaining temperatures in the range of 80° C. to 150° C. and humidities in the range of 70% to 95% relative humidity. Testing of the electronic components at 150° C. and 85% relative humidity provides the required test data within twelve to sixteen hours which heretofore required two to three months of testing at 85° C. and 85% relative humidity.

The environmental chamber of the present invention comprises, essentially, a test chamber adapted to receive the component to be tested, the test chamber being pressurized and supplied with moisturized, heated air to obtain the desired climatic condition. The environmental chamber includes a spray conditioning chamber partitioned from the test chamber, and having a plurality of water spray jets, a mist eliminator, an electric air heater, and a circulating fan. The test chamber includes a perforated air supply plenum and return plenum which communicates with the spray conditioning chamber, whereby air from the test chamber flows through the return plenum into the spray chamber. The air leaves the spray chamber substantially saturated and passes through the mist eliminator, across the air heater, which raises the temperature of the air to the desired dry bulb temperature and then through the circulating fan into the supply plenum.

The water flow circuit for the spray chamber includes a receiving tank communicating with the spray chamber, whereby water from the spray chamber flows by gravity into the receiving tank, the water level of which being controlled by a float operated switch electrically connected to a water supply pump. A circulating pump is connected to the receiving tank and runs continuously, pumping water from the tank through an electric resistance heater positioned at the outlet of the circulating pump, the heated water being pumped to the water spray jets in the spray conditioning chamber.

To compensate for heat loss, the test chamber is surrounded by an insulated housing having a door spaced from a door on the test chamber. The construction and arrangement of the double door assembly allows for the door on the test chamber to effect a pressure seal while the door on the housing effectively isolates the test chamber from any appreciable heat loss. All through piping extends parallel to the wall of the test chamber in a space between the test chamber and the insulated housing to thereby eliminate cold spots for the accumulation of condensation on the piping; and condensation on the blower shaft is eliminated by the use of a small amount of surface heat on the blower shaft sleeve.

DESCRIPTION OF THE PREFERRED EMBODIMENT

Figure 1:
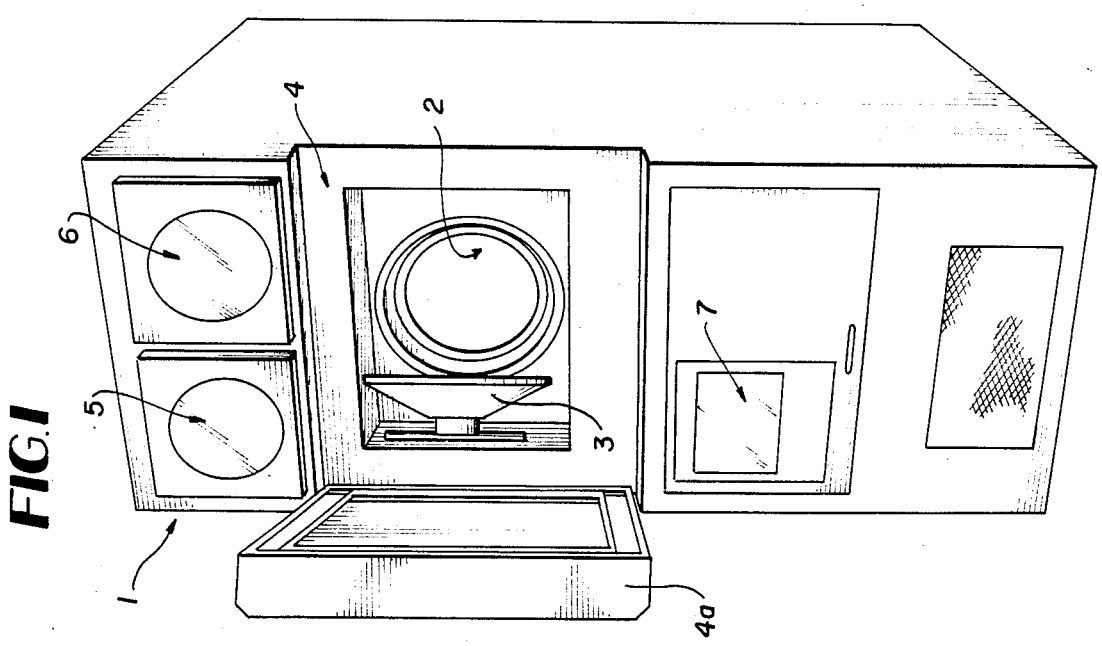
FIG. 1 is a perspective view of the exterior of the environmental chamber of the present invention.

Referring to the drawing and more particularly to FIG. 1, the environmental chamber 1 of the present invention includes a test chamber 2 having a door 3 and an insulation housing 4 surrounding the test chamber, the housing also being provided with a door 4a spaced from the test chamber door 3. The front of the environmental chamber is provided with suitable circular chart recorders 5 and 6 for recording air and water temperatures and relative humidities through a time period, for instance, twenty-four hours or seven days. A microprocessor-based programmer 7 is also provided for entering the temperatures and relative humidities desired at various times during the test period.

Figure 2:
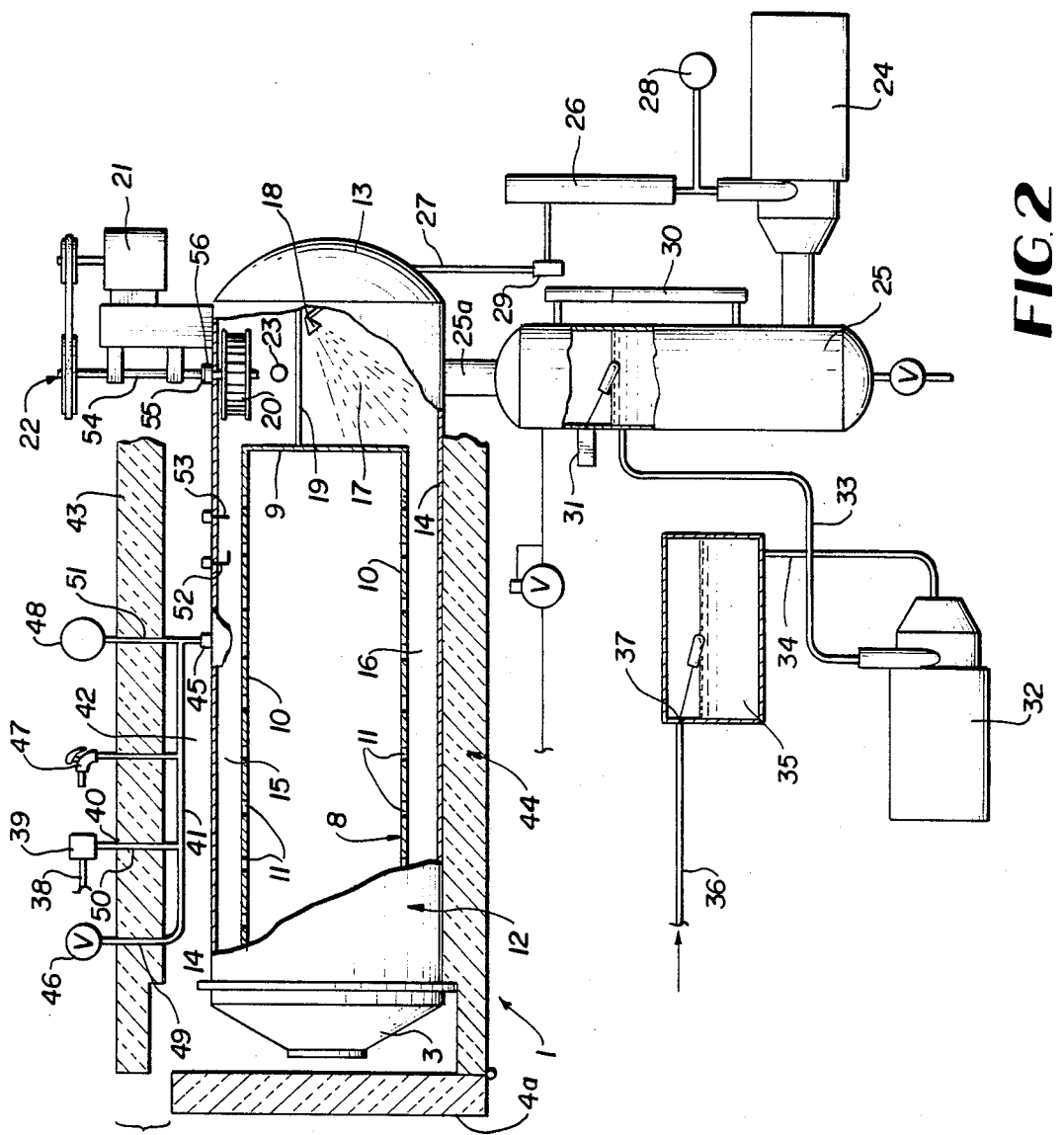
FIG. 2 is a diagrammatic view of the test chamber, spray chamber, water supply system, air blower and pressurized gas system.

The details of the construction of the environmental chamber illustrated in FIG. 1 are shown in FIG. 2 wherein it will be seen that the test chamber 2, for receiving the component to be tested, is provided by a horizontally disposed cylindrical housing 8 having an end wall 9 and a side wall 10 having a plurality of apertures 11 formed therethrough. The housing 8 is mounted coaxially within an outer cylindrical housing 12 having a spherical end wall 13 spaced outwardly from the end wall 9 of the inner housing 8, and a side wall 14 spaced radially outwardly from the side wall 10 of the inner housing 8. The space between the side walls 10 and 14 forms an air supply plenum 15 and an air return plenum 16, and the space between the end walls 9 and 13 forms an air spray chamber 17 containing a water spray header 18 communicating with a plurality of spray jets. A horizontally disposed baffle 19 is disposed in the spray chamber and forms a mist eliminator. A fan 20 is disposed within the housing 12 above the baffle 19 and is driven by a suitable electric motor 21 through a pulley and belt assembly 22. A heating element 23 is also mounted in the housing between the baffle 19 and fan 20.

Water is supplied to the spray header 18 by a circulating pump 24 which draws water from a receiving tank 25 and pumps the water through a heater 26 mounted in the outlet line of the circulating pump. The heated water then flows through line 27 to the spray header. A pressure gauge 28 and temperature gauge 29 are mounted in the outlet lines from the pump 24 and heater 26, respectively.

The receiving tank 25, communicating with the bottom of housing 12 through line 25a, is provided with a sight glass 30 and a float actuated switch 31 for controlling a fill pump 32 which supplies water to the receiving tank 25 through line 33. Water is drawn into the pump 32 through line 34 connected to a fill reservoir 35 which receives water from a source through line 36, the water level in the fill reservoir being controlled by a float actuated valve 37.

To complete the structure of the environmental chamber of the present invention, the test chamber 2 is pressurized by supplying either compressed air, nitrogen or carbon dioxide, depending on test conditions sought, through line 38 having a back pressure controller 39 connected thereto. The pressurized gas flows through a branch line 40 from the back pressure controller 39 to a line 41 extending parallel to the side wall 14 of housing 12 and disposed in a space 42 provided between the housing side wall 14 and the side wall 43 of an insulated housing 44 surrounding the housing 12. The outlet of line 41 communicates with the interior of housing 12 through a fitting 45, a manual vent valve 46, a pressure relief valve 47, and a pressure gauge 48 being connected to the compressed gas line 41 through branch lines 49, 50 and 51, respectively. A wet bulb remote temperature detector 52 and a dry bulb remote temperature detector 53 are also connected to the side wall 14 of the housing 12 and extend into the air supply plenum 15.

By extending the compressed gas line 41 parallel to the cylindrical housing 12 in the space 42 between the housing side wall 14 and the side wall 43 of the insulated housing 44, cold spots on the line 41 are eliminated to thereby prevent the accumulation of condensation thereon. Furthermore, condensation on the shaft 54 of the blower 20 is also eliminated by connecting a small heater 55 to the blower shaft sleeve 56.

In the operation of the environmental chamber of the present invention, the component to be tested is placed in the test chamber 2; the desired temperature and relative humidity are programmed into the assembly and are maintained by controlling the temperature of the water in the spray chamber 17, the moisturized air heated by the heater 23, and the pressure of the compressed gas flowing through line 41 into the housing 12. By the construction and arrangement of the environmental chamber of the present invention, climatic conditions in the temperature range of 80° C. to 150° C. and relative humidities in the range of 70% to 95% are obtainable.

It is to be understood that the form of the invention herewith shown and described is to be taken as a preferred example of the same, and that various changes in the shape, size and arrangement of parts may be resorted to, without departing from the spirit of the invention or scope of the subjoined claims.

I claim:

1. An environmental chamber comprising, a horizontally disposed cylindrical housing forming a test chamber for the component to be tested, said housing having an end wall and a side wall, a plurality of apertures provided in said side wall, said housing being mounted coaxially within an outer cylindrical housing, said outer housing having an end wall spaced outwardly from the end wall of the inner housing and a side wall spaced radially outwardly from the side wall of the inner housing, a door mounted on the other ends of said inner and outer housings, the space between the side walls of the inner and outer housings forming an air supply plenum and an air return plenum, the space between the end walls of the inner and outer housings providing an air spray chamber communicating with said air return plenum, a water spray header having a plurality of spray jets mounted within said spray chamber, a source of heated water connected to said spray header, a horizontally disposed baffle disposed in said spray chamber in proximity to said water spray header for providing a mist eliminator, fan means mounted in said outer housing above the baffle for circulating air into the air supply plenum, heater means mounted in the outer housing between the baffle and the fan means, a source of pressurized gas connected to said outer housing and communicating with said test chamber, an insulated housing surrounding said outer housing, and a door on an end of said insulated housing spaced from the door of the inner and outer housings, whereby the inner door effects a pressure seal and the outer door isolates the test chamber from any appreciable heat loss.

2. An environmental chamber according to claim 1, wherein the source of heated water comprises, a receiving tank communicating with the bottom of the outer housing, a circulating pump having an intake connected to the bottom of said receiving tank, a water heater connected to the outlet of said circulating pump, a pipe line connected between the water heater and the spray header, a water reservoir, and a fill pump connected between the reservoir and the receiving tank for maintaining a desired water level in said receiving tank.

3. An environmental chamber according to claim 1, wherein the source of compressed gas is connected to an end portion of a pipe extending parallel to the wall of the outer chamber and disposed in a space between the insulated housing and the wall of the outer housing, the other end portion of said pipe being connected to the wall of said outer housing and communicating with said test chamber, whereby cold spots on the pipe are eliminated, to thereby prevent the accumulation of condensation thereon.

4. An environmental chamber according to claim 3, wherein a manual vent valve, a back pressure controller, a pressure relief valve, and pressure gauge are connected to the compressed gas pipe.

5. An environmental chamber according to claim 3, wherein a wet bulb remote temperature detector and a dry bulb remote temperature detector are mounted in the air supply plenum.

6. An environmental chamber according to claim 1, wherein the fan means comprises, an impeller mounted in the outer housing above the baffle, a shaft sleeve mounted on the side wall of the outer housing, a drive shaft connected to said impeller and extending through the shaft sleeve, and a heater connected to said shaft sleeve to thereby prevent the accumulation of condensation thereon.

* * * * *